(12) United States Patent
Gomm et al.

(10) Patent No.: US 10,177,024 B2
(45) Date of Patent: Jan. 8, 2019

(54) HIGH TEMPERATURE SUBSTRATE PEDESTAL MODULE AND COMPONENTS THEREOF

(71) Applicant: Lam Research Corporation, Fremont, CA (US)

(72) Inventors: Troy Alan Gomm, Sherwood, OR (US); Timothy Thomas, Wilsonville, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 531 days.

(21) Appl. No.: 14/710,151

(22) Filed: May 12, 2015

(65) Prior Publication Data

US 2016/0336213 A1 Nov. 17, 2016

(51) Int. Cl.
*H01L 21/687* (2006.01)
*H01L 21/285* (2006.01)
(Continued)

(52) U.S. Cl.
CPC .... *H01L 21/68785* (2013.01); *C23C 16/4409* (2013.01); *C23C 16/4586* (2013.01);
(Continued)

(58) Field of Classification Search
None
See application file for complete search history.

(56) References Cited

U.S. PATENT DOCUMENTS 5,569,356 A 10/1996 Lenz et al.
5,688,331 A 11/1997 Aruga et al.
(Continued)

FOREIGN PATENT DOCUMENTS

JP 07-153706 A 6/1995
JP 2012-182221 A 9/2012

*Primary Examiner* — Sylvia MacArthur
(74) *Attorney, Agent, or Firm* — Buchanan Ingersoll & Rooney LLP

(57) ABSTRACT

A semiconductor substrate processing apparatus comprises a vacuum chamber in which a semiconductor substrate may be processed, a showerhead module through which process gas from a process gas source is supplied to a processing zone of the vacuum chamber, and a substrate pedestal module. The substrate pedestal module includes a platen, a stem having a side wall defining a cylindrical interior region thereof, a lower surface, and an upper end that supports the platen, and an adapter having a side wall defining a cylindrical interior region thereof and an upper surface that supports the stem. The lower surface of the stem includes a gas inlet in fluid communication with a respective gas passage located in the side wall of the stem and a gas outlet located in an annular gas channel in the upper surface of the adapter. The upper surface of the adapter includes an inner groove located radially inward of the gas outlet and an outer groove located radially outward of the inner groove. The inner groove and the outer groove have respective O-rings therein so as to form a vacuum seals during processing. The platen includes at least one platen gas passage in fluid communication with a respective gas passage in the side wall of the stem through which backside gas can be supplied to a region below a semiconductor substrate when supported on the upper surface of the platen during processing.

11 Claims, 7 Drawing Sheets

(51) Int. Cl.
*H01J 37/32* (2006.01)
*C23C 16/505* (2006.01)
*C23C 16/458* (2006.01)
*H01L 21/02* (2006.01)
*C23C 16/455* (2006.01)
*H01L 21/67* (2006.01)
*H01L 21/683* (2006.01)
*C23C 16/44* (2006.01)
*C23C 16/509* (2006.01)

(52) U.S. Cl.
CPC ...... *C23C 16/509* (2013.01); *H01J 37/32082* (2013.01); *H01J 37/32715* (2013.01); *H01J 37/32724* (2013.01); *H01L 21/0228* (2013.01); *H01L 21/02271* (2013.01); *H01L 21/02274* (2013.01); *H01L 21/67103* (2013.01); *H01L 21/67126* (2013.01); *H01L 21/6831* (2013.01); *H01L 21/68757* (2013.01); *H01L 21/68792* (2013.01)

(56) References Cited

U.S. PATENT DOCUMENTS

| | | | |
|---|---|---|---|
| 6,035,101 A | 3/2000 | Sajoto et al. | |
| 6,223,447 B1 | 5/2001 | Yudovsky et al. | |
| 6,494,955 B1 | 12/2002 | Lei et al. | |
| 6,524,428 B2 * | 2/2003 | Tamura | H01L 21/67109 118/500 |
| 6,616,767 B2 | 9/2003 | Zhao et al. | |
| 6,860,965 B1 | 3/2005 | Stevens | |
| 6,962,348 B2 | 11/2005 | Fink | |
| 6,997,993 B2 | 2/2006 | Yamaguchi et al. | |
| 7,126,808 B2 | 10/2006 | Koo et al. | |
| 7,241,346 B2 * | 7/2007 | Hanamachi | C23C 16/4409 118/724 |
| 7,274,006 B2 | 9/2007 | Okajima et al. | |
| 7,326,886 B2 * | 2/2008 | Inoue | H01L 21/67103 174/262 |
| 7,436,645 B2 * | 10/2008 | Holland | H01L 21/67103 361/230 |
| 7,645,341 B2 | 1/2010 | Kennedy et al. | |
| 7,737,035 B1 | 6/2010 | Lind et al. | |
| 7,869,184 B2 | 1/2011 | Steger | |
| 8,294,069 B2 | 10/2012 | Goto et al. | |
| 8,540,819 B2 * | 9/2013 | Kataigi | C23C 16/45521 118/715 |
| 8,753,447 B2 | 6/2014 | Lind et al. | |
| 8,801,950 B2 | 8/2014 | Lee | |
| 8,840,754 B2 | 9/2014 | Hao | |
| 8,851,463 B2 | 10/2014 | Angelov et al. | |
| 9,738,975 B2 * | 8/2017 | Gomm | C23C 16/4586 |
| 2002/0050246 A1 * | 5/2002 | Parkhe | H01L 21/67109 118/500 |
| 2003/0136520 A1 * | 7/2003 | Yudovsky | C23C 16/45521 156/345.51 |
| 2003/0183341 A1 | 10/2003 | Yamaguchi et al. | |
| 2007/0169703 A1 | 7/2007 | Elliot et al. | |
| 2009/0235866 A1 * | 9/2009 | Kataigi | C23C 16/45521 118/725 |
| 2011/0096461 A1 | 4/2011 | Yoshikawa et al. | |
| 2013/0092086 A1 | 4/2013 | Keil et al. | |
| 2014/0087587 A1 | 3/2014 | Lind | |
| 2014/0231019 A1 | 8/2014 | Kajihara | |
| 2014/0302256 A1 | 10/2014 | Chen et al. | |
| 2015/0011096 A1 | 1/2015 | Chandrasekharan et al. | |
| 2016/0336213 A1 * | 11/2016 | Gomm | H01L 21/68785 |

* cited by examiner

US 10,177,024 B2

HIGH TEMPERATURE SUBSTRATE PEDESTAL MODULE AND COMPONENTS THEREOF

FIELD OF THE INVENTION

This invention pertains to semiconductor substrate processing apparatuses for processing semiconductor substrates, and may find particular use in plasma enhanced chemical vapor depositions processing apparatuses operable to deposit thin films on an upper surface of a semiconductor substrate.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL) processing, and resist removal. One type of semiconductor substrate processing apparatus is a plasma processing apparatus that includes a reaction chamber containing upper and lower electrodes wherein a radio frequency (RF) power is applied between the electrodes to excite a process gas into plasma for processing semiconductor substrates in the reaction chamber.

SUMMARY

Disclosed herein is a semiconductor substrate processing apparatus for processing semiconductor substrates including a high temperature substrate pedestal module having a minimized mounting area between a lower surface of a stem and an upper surface of an adapter that supports the stem. The semiconductor substrate processing apparatus comprises a vacuum chamber that includes a processing zone in which a semiconductor substrate may be processed, a showerhead module through which process gas from a process gas source is supplied to the processing zone of the vacuum chamber, and a substrate pedestal module. The substrate pedestal module includes a platen having an upper surface configured to support a semiconductor substrate thereon during processing, a stem of ceramic material having a side wall defining a cylindrical interior region thereof, a lower surface, and an upper end that supports the platen, and an adapter having a side wall defining a cylindrical interior region thereof and an upper surface that is attached to the lower surface of the stem.

The lower surface of the stem includes at least one gas inlet in fluid communication with a respective gas passage located in the side wall of the stem. The at least one gas inlet is in fluid communication with at least one gas outlet located in an annular gas channel in the upper surface of the adapter. The upper surface of the adapter includes an inner groove located radially inward of the at least one gas outlet and an outer groove located radially outward of the inner groove. The inner groove has an inner O-ring therein so as to form an inner vacuum seal between the cylindrical interior region of the adapter and the at least one gas outlet during processing. The outer groove has an outer O-ring therein so as to form an outer vacuum seal between a region surrounding the side wall of the adapter and the at least one gas outlet during processing. The platen includes at least one platen gas passage in fluid communication with a respective gas passage in the side wall of the stem through which backside gas can be supplied to a region below a semiconductor substrate when supported on the upper surface of the platen during processing.

Also disclosed herein is a high temperature substrate pedestal module of a semiconductor substrate processing apparatus. The high temperature substrate pedestal module comprises a platen that has an upper surface configured to support a semiconductor substrate thereon during processing and a stem that has a side wall that defines a cylindrical interior region thereof, a lower surface, and an upper end that supports the platen. The lower surface of the stem is configured to be attached to an upper surface of an adapter. The lower surface of the stem includes an annular gas channel having at least one gas inlet therein wherein the at least one gas inlet is in fluid communication with a respective gas passage located in the side wall of the stem and the at least one gas inlet in the lower surface of the stem is configured to be in fluid communication with at least one gas outlet in an upper surface of an adapter when the stem is attached to an adapter. The platen includes at least one platen gas passage in fluid communication with a respective gas passage in the side wall of the stem through which backside gas can be supplied to a region below a semiconductor substrate when supported on the upper surface of the platen during processing.

Further disclosed herein is an adapter of a high temperature substrate pedestal module of a semiconductor substrate processing apparatus. The adapter is configured to support a stem of the substrate pedestal module in a vacuum chamber of the semiconductor substrate processing apparatus. The adapter comprises a side wall defining a cylindrical interior region of the adapter and an upper surface configured to attach to a lower surface of a stem. The upper surface of the adapter includes an annular gas channel having at least one gas outlet in fluid communication with a respective gas passage located in the side wall of the adapter. The at least one gas outlet is configured to be in fluid communication with at least one gas inlet in a lower surface of a stem when the upper surface of the adapter is attached to lower surface of the stem. The upper surface of the adapter includes an inner groove located radially inward of the at least one gas outlet and an outer groove located radially outward of the inner groove. The inner groove is configured to include an inner O-ring therein when the adapter is attached to the stem such that an inner vacuum seal is formed between the cylindrical interior region of the adapter and the at least one gas outlet during processing. The outer groove is configured to include an outer O-ring therein when the adapter is attached to the stem such that an outer vacuum seal is formed between a region surrounding the side wall of the adapter and the at least one gas outlet during processing.

BRIEF DESCRIPTION OF THE DRAWING FIGURES

DETAILED DESCRIPTION

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

As indicated, present embodiments provide apparatus and associated methods for processing a semiconductor substrate in a semiconductor substrate processing apparatus such as a chemical vapor deposition or a plasma-enhanced chemical vapor deposition apparatus. The apparatus and methods are particularly applicable for use in conjunction with high temperature processing of semiconductor substrates such as a high temperature deposition processes wherein a semiconductor substrate being processed is heated to temperatures greater than about 550° C., such as about 550° C. to about 650° C. or more.

Figure 1:
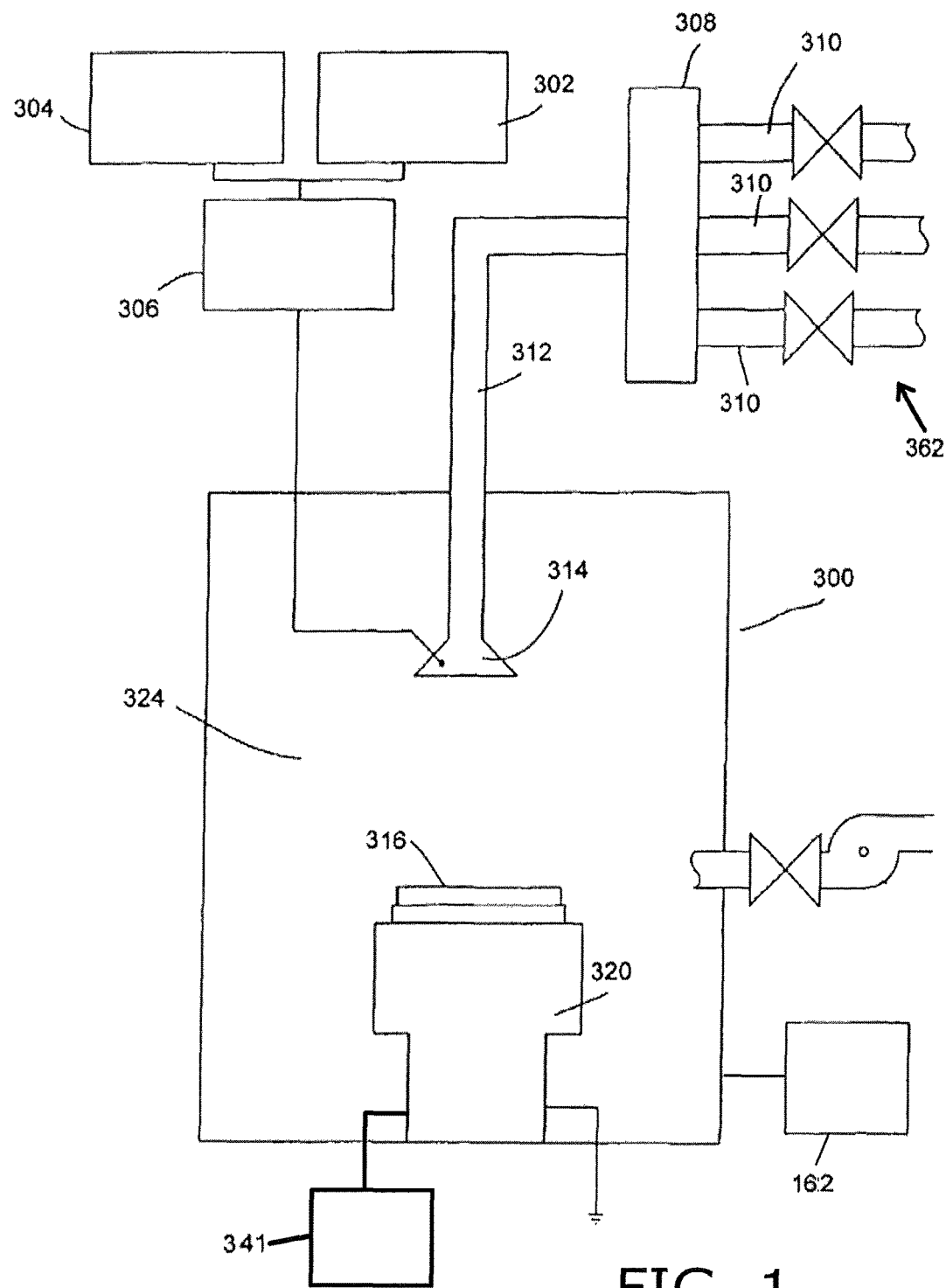
FIG. 1 is a schematic diagram showing an overview of a chemical deposition apparatus in accordance with embodiments disclosed herein.

Embodiments disclosed herein are preferably implemented in a plasma-enhanced chemical deposition apparatus (i.e. PECVD apparatus, PEALD apparatus, or PEPDL apparatus), however, they are not so limited. FIG. 1 provides a simple block diagram depicting various semiconductor substrate plasma processing apparatus components arranged for implementing embodiments as disclosed herein. As shown, a semiconductor substrate plasma processing apparatus 300 includes a vacuum chamber 324 that serves to contain plasma in a processing zone, which can be generated by a showerhead module 314 having an upper RF electrode (not shown) therein working in conjunction with a substrate pedestal module 320 having a lower RF electrode (not shown) therein. At least one RF generator is operable to supply RF energy into a processing zone above an upper surface of a semiconductor substrate 316 in the vacuum chamber 324 to energize process gas supplied into the processing zone of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the upper RF electrode of the showerhead module 314 such that RF energy may be supplied to the processing zone above the semiconductor substrate 316 in the vacuum chamber 324.

The power and frequency of RF energy supplied by matching network 306 to the interior of the vacuum chamber 324 is sufficient to generate plasma from the process gas. In an embodiment both the high-frequency RF generator 302 and the low-frequency RF generator 304 are used, and in an alternate embodiment, just the high-frequency RF generator 302 is used. In a process, the high-frequency RF generator 302 may be operated at frequencies of about 2-100 MHz; in a preferred embodiment at 13.56 MHz or 27 MHz. The low-frequency RF generator 304 may be operated at about 50 kHz to 2 MHz; in a preferred embodiment at about 350 to 600 kHz. The process parameters may be scaled based on the chamber volume, substrate size, and other factors. Similarly, the flow rates of process gas, may depend on the free volume of the vacuum chamber or processing zone.

An upper surface of the substrate pedestal module 320 supports a semiconductor substrate 316 during processing within the vacuum chamber 324. The substrate pedestal module 320 can include a chuck to hold the semiconductor substrate and/or lift pins to raise and lower the semiconductor substrate before, during and/or after the deposition and/or plasma treatment processes. In an alternate embodiment, the substrate pedestal module 320 can include a carrier ring to raise and lower the semiconductor substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal module including an electrostatic chuck can be found in commonly-assigned U.S. Pat. No. 8,840,754, which is incorporated herein by reference in its entirety. Details of a carrier ring for a substrate pedestal module can be found in commonly-assigned U.S. Pat. No. 6,860,965, which is incorporated herein by reference in its entirety. A backside gas supply 341 is operable to supply a heat transfer gas or purge gas through the substrate pedestal module 320 to a region below a lower surface of the semiconductor substrate during processing. The substrate pedestal module 320 includes the lower RF electrode therein wherein the lower RF electrode is preferably grounded during processing, however in an alternate embodiment, the lower RF electrode may be supplied with RF energy during processing.

To process a semiconductor substrate in the vacuum chamber 324 of the semiconductor substrate plasma processing apparatus 300, process gases are introduced from a process gas source 362 into the vacuum chamber 324 via inlet 312 and showerhead module 314 wherein the process gas is formed into plasma with RF energy such that a film may be deposited onto the upper surface of the semiconductor substrate. In an embodiment, the process gas source 362 can comprise multiple gas lines 310 connected to a heated manifold 308. The gases may be premixed or supplied separately to the chamber. Appropriate valving and mass flow control mechanisms are employed to ensure that the correct gases are delivered through the showerhead module 314 during semiconductor substrate processing. During the processing, a backside heat transfer gas or purge gas is supplied to a region below a lower surface of the semiconductor substrate supported on the substrate pedestal module 320. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 162 is employed to control process conditions during deposition, post deposition treatments, and/or other process operations. The controller 162 will typically include one or more memory devices and one or more processors. The processor may include a CPU or computer, analog and/or digital input/output connections, stepper motor controller boards, etc.

In certain embodiments, the controller 162 controls all of the activities of the apparatus. The system controller 162 executes system control software including sets of instructions for controlling the timing of the processing operations, frequency and power of operations of the low-frequency RF generator 304 and the high-frequency RF generator 302, flow rates and temperatures of precursors and inert gases and their relative mixing, temperature of a semiconductor substrate 316 supported on an upper surface of the substrate pedestal module 320 and a plasma exposed surface of the showerhead module 314, pressure of the vacuum chamber 324, and other parameters of a particular process. Other computer programs stored on memory devices associated with the controller may be employed in some embodiments.

Typically there will be a user interface associated with controller 162. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the semiconductor substrate, pressure of the chamber and other parameters of a particular process, These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the vacuum chamber 324.

FIGS. 2-7 illustrate cross sections of a substrate pedestal module 320 according to embodiments as disclosed herein. As shown in FIGS. 2-7, the substrate pedestal module 320 includes a platen 205 having exposed surfaces made of ceramic material. The platen 205 has an upper surface 206 that is operable to support a semiconductor substrate thereon during processing of the semiconductor substrate. A stem 210 made of ceramic material extends downwardly from a lower surface of the platen 205 wherein an upper end 214 of the stem 210 supports the platen 205. Preferably, the upper end 214 of the stem 205 includes an upper flange that is bonded (brazed, welded, diffusion bonded or other suitable technique) to a lower ceramic surface of the platen 205. By making the stem 210 and the platen 205 of the substrate pedestal module 320 from ceramic materials rather than a metal material, such as aluminum or an aluminum alloy, the substrate pedestal module 320 may withstand high temperatures during high temperature substrate processing, such as temperatures greater than about 550° C. or temperatures greater than about 650° C.

The platen 205 can include at least one electrostatic clamping electrode 209 embedded therein wherein the at least one electrostatic clamping electrode 209 is operable to electrostatically clamp a semiconductor substrate on the upper surface 206 of the platen 205 during processing. As shown in FIGS. 2 and 4-7, the platen 205 can also include a lower RF electrode 265 that may be grounded or supplied with RF power during processing of a semiconductor substrate. Preferably, as shown in FIG. 3, the platen 205 includes only a single electrode 209a embedded therein that serves as both an electrostatic clamping electrode and a RF electrode. Referring back to FIGS. 2-7, the platen 205 can also include at least one heater 260 embedded therein that is operable to control the temperature across the upper surface 206 of the platen 205 and thereby the temperature across the semiconductor substrate during processing. The at least one heater 260 can include electrically resistive heater film and/or one or more thermoelectric modules. Preferably, electrical connections to the at least one electrostatic clamping electrode 209, the at least one heater 260, the single electrode 209a, and/or the lower RF electrode 265 are disposed in a cylindrical interior region 215 of the stem 210 which is defined by a side wall 211 of the stem 210. The electrical connections may be respectively connected to electrical contacts (not shown) formed in the platen 205 that are in electrical communication with the respective at least one electrostatic clamping electrode 209, the at least one heater 260, the single electrode 209a and/or the lower RF electrode 265. In this manner, the at least one electrostatic clamping electrode 209, the at least one heater 260, the single electrode 209a and/or the lower RF electrode 265 may be powered during processing of a semiconductor substrate.

In an embodiment, the platen 205 can include discrete layers that are diffusion bonded together wherein the at least one electrostatic clamping electrode 209, the lower RF electrode 265 (or the single electrode 209a), and the at least one heater 260 can be sandwiched between the discrete layers of the platen 205. The upper surface 206 of the platen 205 preferably includes a mesa pattern 206a formed therein wherein a lower surface of a semiconductor substrate is supported on the mesa pattern 206a and a backside purge gas or a backside heat transfer gas can be supplied to the region below the semiconductor substrate between the mesas of the mesa pattern 206a. An exemplary embodiment of a mesa pattern and method of forming a mesa pattern can be found in commonly assigned U.S. Pat. No. 7,869,184, which is hereby incorporated herein in its entirety. In an embodiment, the substrate pedestal module 320 can include a heat shield (not shown) operable to reduce heat transfer between an upper portion of the platen 205 and the stem 210. An exemplary embodiment of a substrate pedestal module that includes a heat shield can be found in commonly assigned U.S. Pat. No. 8,753,447, which is hereby incorporated herein in its entirety.

The exposed surfaces of the platen 205 and the stem 210 are made of ceramic material preferably which preferably does not lead to substrate contamination during processing when the platen 205 and stem 210 are exposed to processing conditions. Preferably the exposed surfaces of the platen 205 and the stem 210 are made from aluminum nitride.

The stem 210 includes a lower surface 213 that is attached to an upper surface 223 of an adapter 220 such that the substrate pedestal module 320 can be supported in a vacuum chamber of a semiconductor substrate processing apparatus. The adapter 220 has a side wall 221 that defines a cylindrical interior region 225 thereof. The lower surface 213 of the stem 210 includes at least one gas inlet 216 that is in fluid communication with a respective gas passage 217 that is located in the side wall 211 of the stem 210. The at least one gas inlet 216 of the stem 210 is in fluid communication with at least one gas outlet 224 in the upper surface 223 of the adapter 220 wherein the at least one gas outlet 224 is in fluid communication with a respective gas passage 232 in the in the side wall 221 of the adapter 220. The platen 205 includes at least one platen gas passage 280 that is in fluid communication with a respective gas passage 217 in the side wall 211 of the stem 210. Backside gas may be supplied from a backside gas supply that is in fluid communication with at least one gas passage 232 in the side wall 221 of the adapter 220 to a region below a semiconductor substrate when supported on the upper surface 206 of the platen 205 via the at least one gas passage 217 of the stem 210 during processing of the semiconductor substrate.

Figure 2:
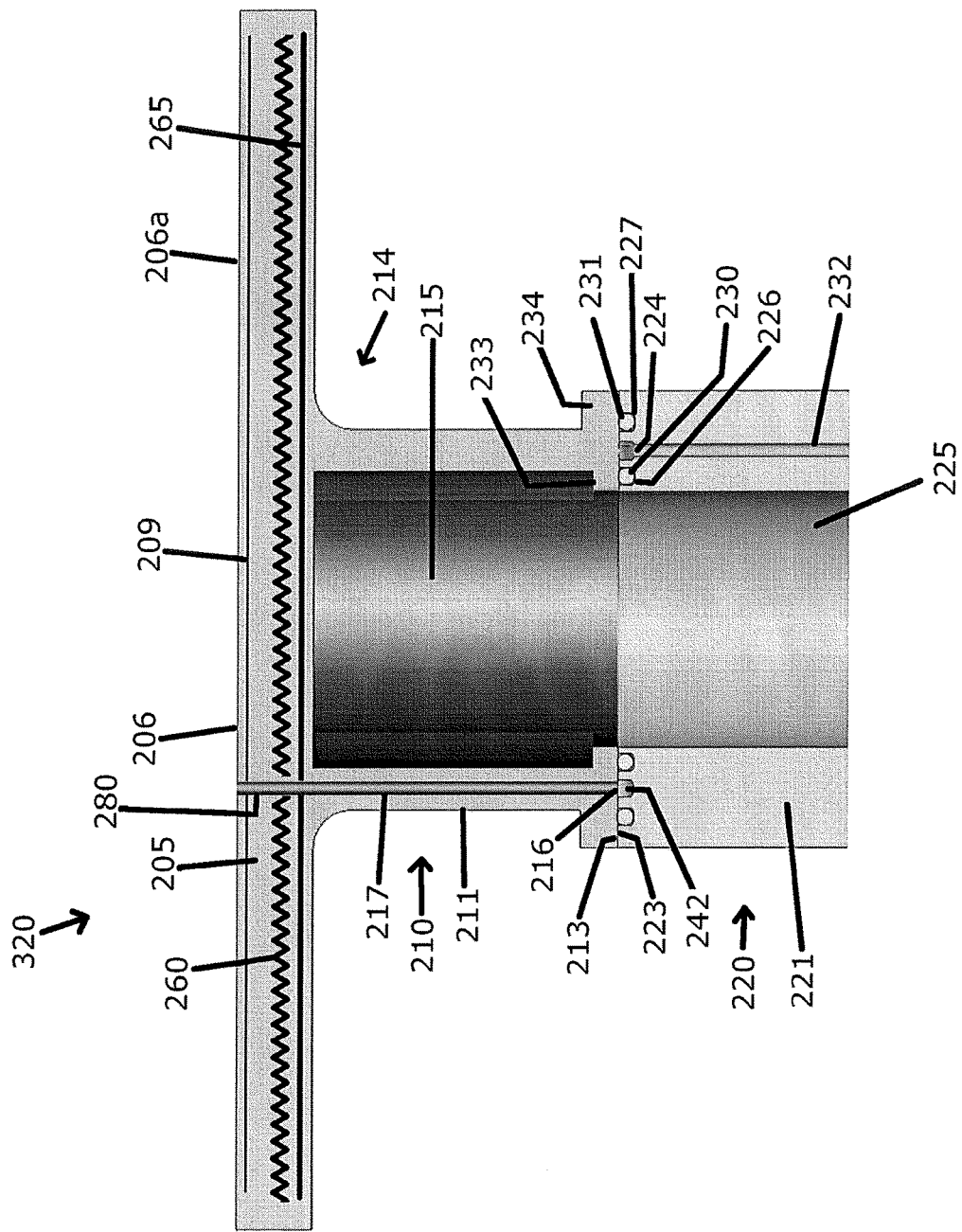
FIG. 2 illustrates a cross section of a substrate pedestal module according to an embodiment as disclosed herein.
Figure 3:
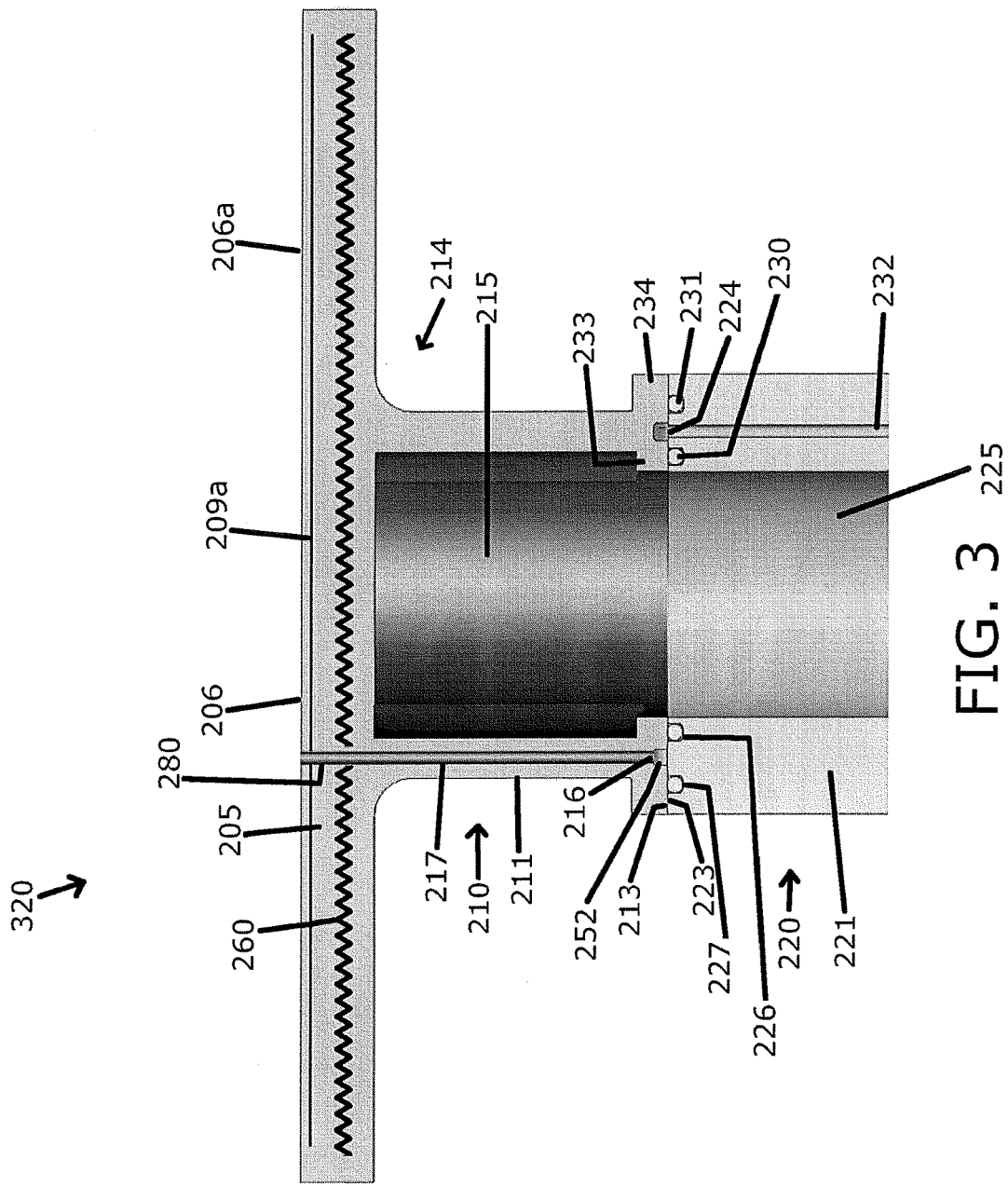
FIG. 3 illustrates a cross section of a substrate pedestal module according to an embodiment as disclosed herein.
Figure 5:
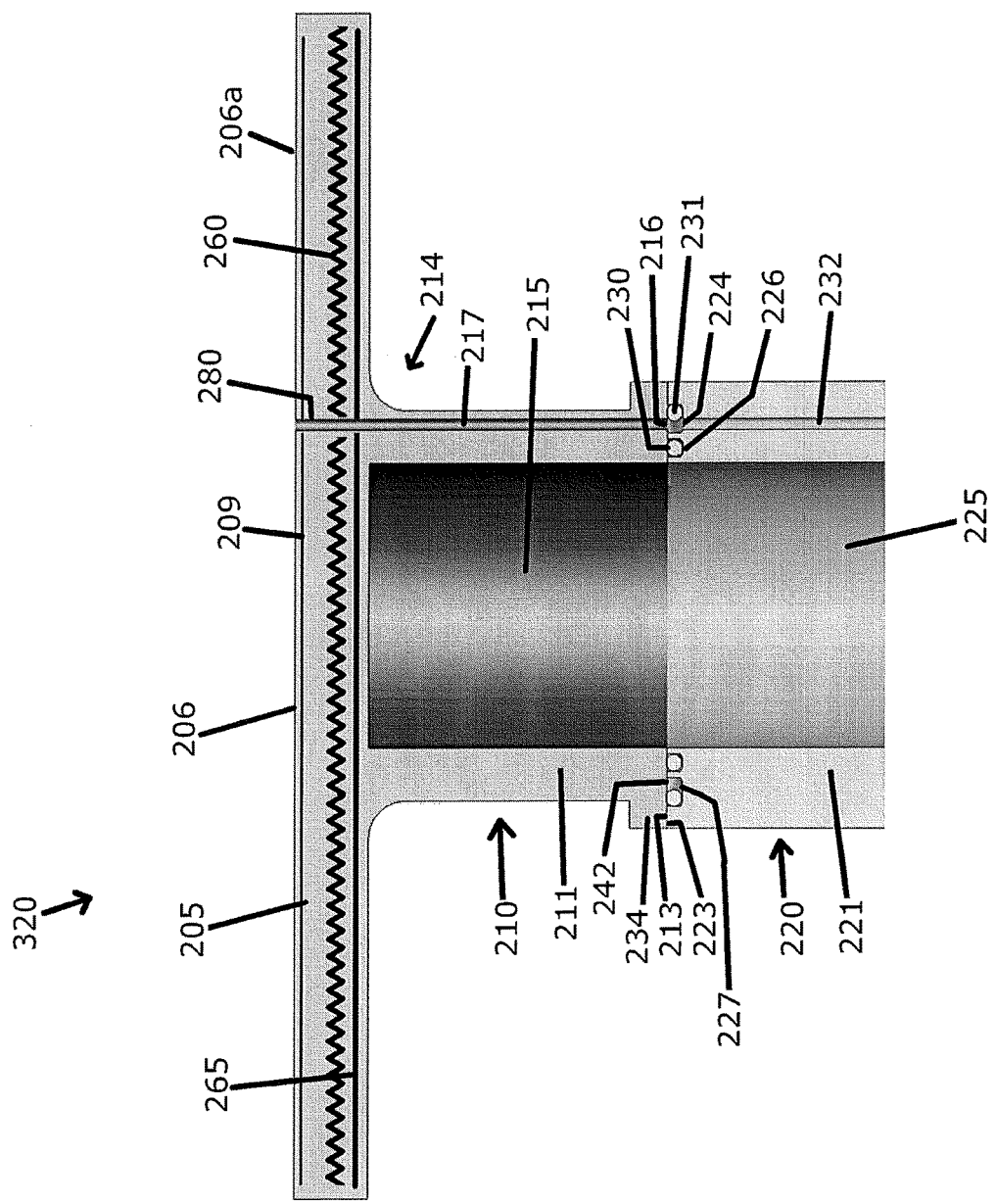
FIG. 5 illustrates a cross section of a substrate pedestal module according to an embodiment as disclosed herein.
Figure 6:
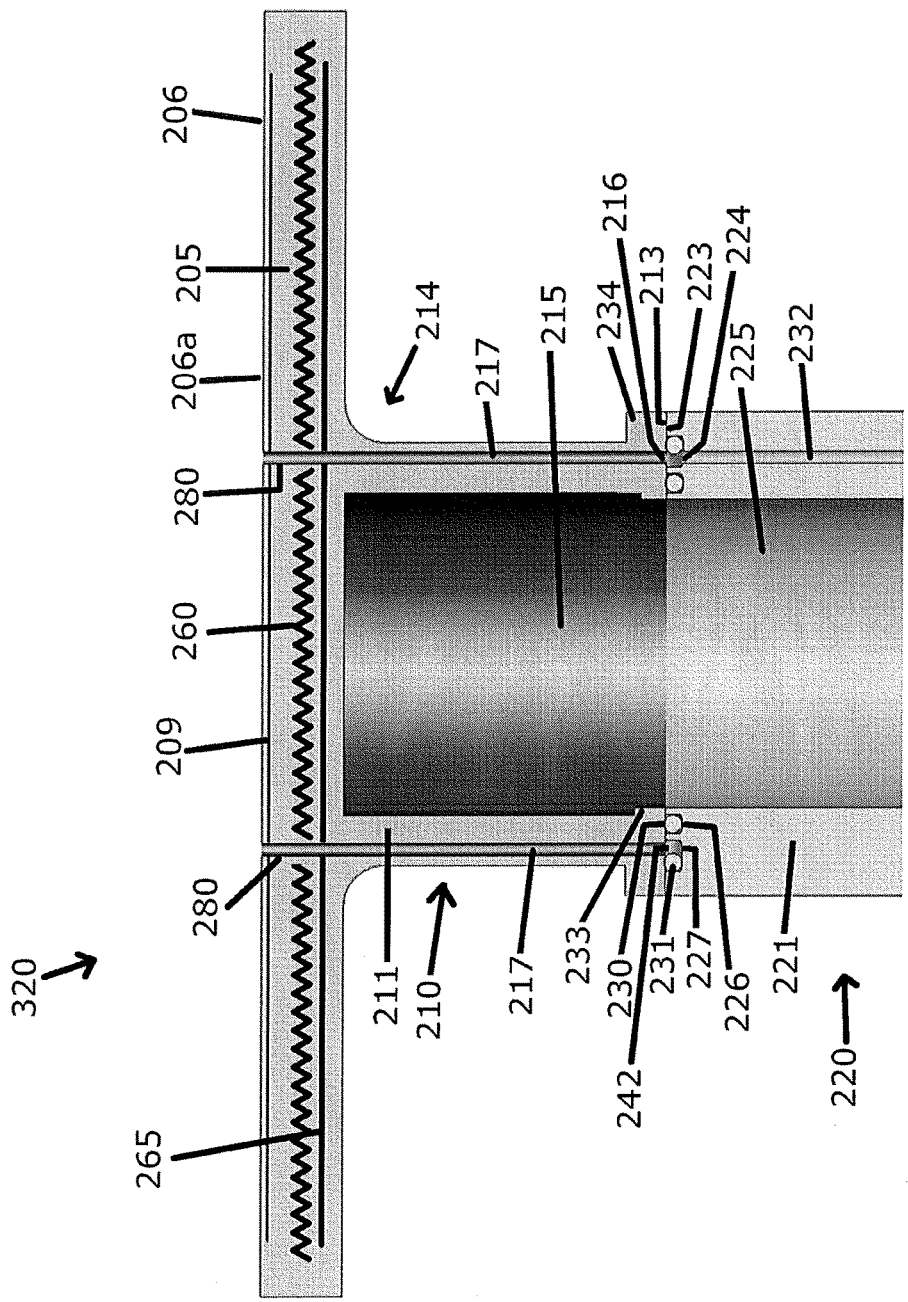
FIG. 6 illustrates a cross section of a substrate pedestal module according to an embodiment as disclosed herein.

Referring now to FIGS. 2, 5, and 6, the at least one gas outlet 224 in the upper surface 223 of the adapter 220 is preferably located in an annular gas channel 242 in the upper surface 223 of the adapter 220. As used herein, the term "annular gas channel" can refer to a gas channel that forms an unbroken annular path, a gas channel that extends partially along an annular path, or two or more gas channels that each extend along respective annular paths having a common center point wherein each of the gas channels are fluidly isolate from one another. The upper surface 223 of the adapter 220 also includes an inner groove 226 located radially inward of the at least one gas outlet 224 and an outer groove 227 located radially outward of the inner groove 226. The inner groove 226 has an inner O-ring 230 therein so as to form an inner vacuum seal between the cylindrical interior region 225 of the adapter 220 and the at least one gas outlet 224 during processing of a semiconductor substrate. The outer groove 227 has an outer O-ring 231 therein so as to form an outer vacuum seal between a region surrounding the side wall 221 of the adapter 220 and the at least one gas outlet 224 during processing of a semiconductor substrate.

Referring now to FIGS. 5 and 6, the annular gas channel 242 in the upper surface 223 of the adapter 220 is preferably formed in a radially inner portion of the outer groove 227 of the adapter 220 wherein the outer O-ring 231 is located in a radially outer portion of the outer groove 227.

Figure 4:
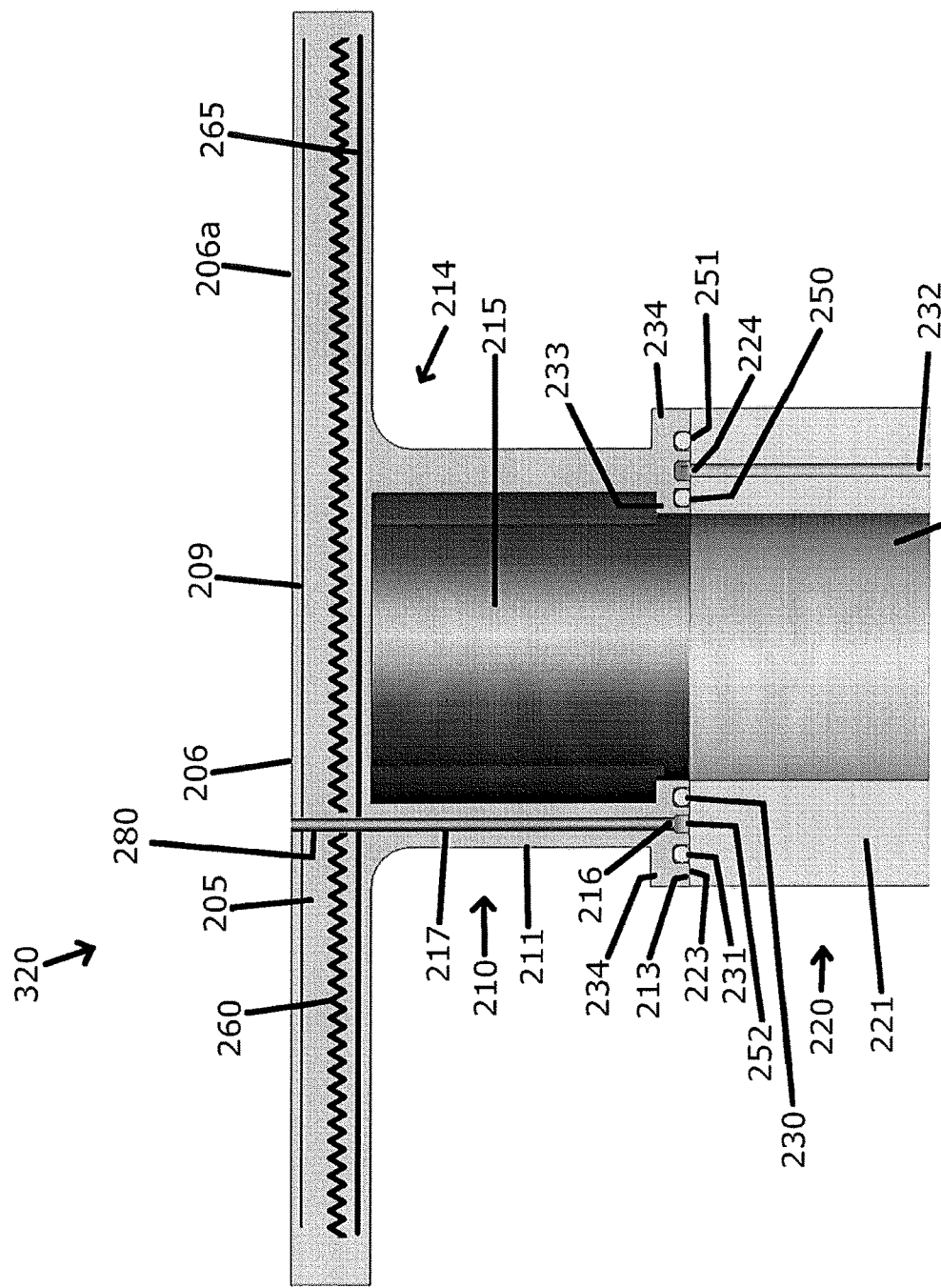
FIG. 4 illustrates a cross section of a substrate pedestal module according to an embodiment as disclosed herein.
Figure 7:
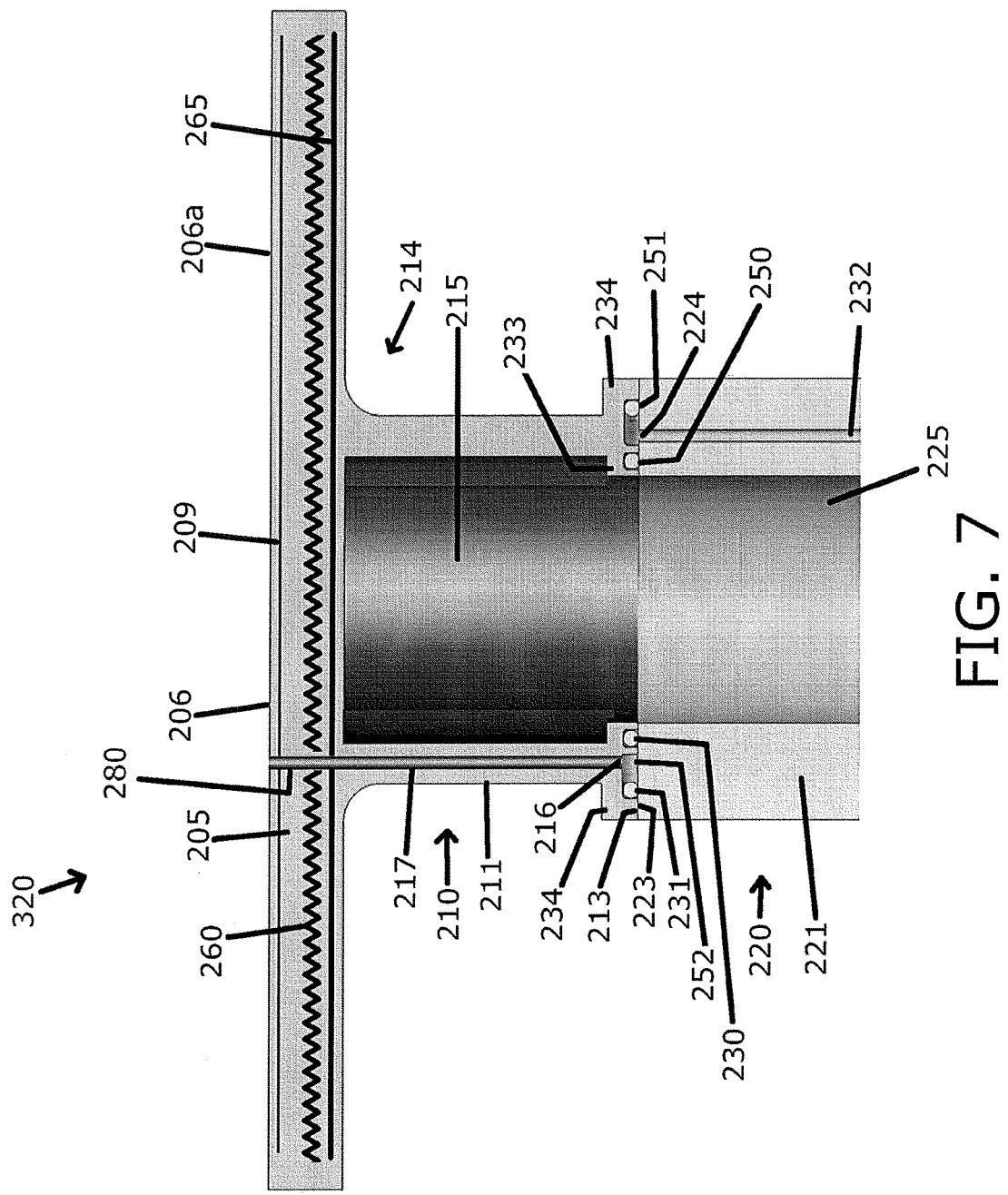
FIG. 7 illustrates a cross section of a substrate pedestal module according to an embodiment as disclosed herein.

In an alternate embodiment, as illustrated in FIGS. 3, 4, and 7, an annular gas channel 252 is included in the lower surface 213 of the stem 210 instead of, or in addition to, the annular gas channel 242 in the upper surface 223 of the adapter 220 (see FIG. 2). The at least one gas outlet 224 of the adapter 220 is in fluid communication with the annular gas channel 252 in the lower surface 213 of the stem 210. The at least one gas inlet 216 in the lower surface 213 of the stem 210 is located in the annular gas channel 252 formed in the lower surface 213 of the stem 210. In an embodiment wherein the lower surface 213 of the stem 210 includes the annular gas channel 252 and the upper surface 223 of the adapter 220 includes the annular gas channel 242, the annular gas channels 242, 252 are arranged to be adjacent to each other such that they are in fluid communication.

Referring to FIG. 3, the upper surface 223 of the adapter 220 preferably includes an inner groove 226 located radially inward of the at least one gas outlet 224 and an outer groove 227 located radially outward of the inner groove 226. The inner groove 226 has an inner O-ring 230 therein so as to form an inner vacuum seal between the cylindrical interior region 225 of the adapter 220 and the at least one gas outlet 224 during processing of a semiconductor substrate. The outer groove 227 has an outer O-ring 231 therein so as to form an outer vacuum seal between a region surrounding the side wall 221 of the adapter 220 and the at least one gas outlet 224 during processing of a semiconductor substrate.

Referring now to FIG. 4, the lower surface 213 of the stem 210 can include an inner groove 250 and an outer groove 251 instead of, or in addition to, the inner groove 226 and outer groove 227 in the upper surface 223 of the adapter 220 (see FIG. 2). The inner groove 250 has an inner O-ring 230 therein so as to form an inner vacuum seal between the cylindrical interior region 225 of the adapter 220 and the at least one gas outlet 224 during processing of a semiconductor substrate. The outer groove 251 has an outer O-ring 231 therein so as to form an outer vacuum seal between a region surrounding the side wall 221 of the adapter 220 and the at least one gas outlet 224 during processing of a semiconductor substrate. In an embodiment wherein the lower surface 213 of the stem 210 includes the inner groove 250 and the outer groove 251, and the upper surface 223 of the adapter 220 includes the inner groove 226 and the outer groove 227, the inner grooves 250, 226 are preferably arranged to be adjacent to each other such that a portion of the inner O-ring 230 is included in each of the inner grooves 250, 226 and the outer grooves 251, 227 are preferably arranged to be adjacent to each other such that a portion of the outer O-ring 231 is included in each of the outer grooves 251, 227.

Referring now to FIG. 7, the annular gas channel 252 in the lower surface 213 of the stem 210 is preferably formed in a radially inner portion of the outer groove 251 of the stem 210 wherein the outer O-ring 231 is preferably located in a radially outer portion of the outer groove 251.

Referring now to FIGS. 2-7, the stem 210 preferably includes a lower outer flange 234 that extends outwardly from the side wall 211 of the stem 210 such that the thickness of the side wall 211 of the stem 210 above the lower outer flange 234 may be minimized to form a thermal choke between the platen 205 and the lower surface 213 of the stem 210 during processing. The lower outer flange 234 can include through holes (not shown) such that the stem 210 of the substrate pedestal module 320 may be attached to the upper surface 223 of the adapter 220 with fasteners such as bolts, screws, or the like. During processing, the cylindrical interior 215 of the stem 210 and the cylindrical interior 225 of the adapter 220 are in fluid communication and are sealed from the vacuum environment by the inner O-ring 230 and the outer O-ring 231 such that a positive pressure may be maintained in the cylindrical interior regions 215, 225. Preferably, the cylindrical interior regions 215, 225 are exposed to the atmosphere, however in an alternate embodiment an inert or purge gas may be pumped therein.

The stem 210 is formed of ceramic and preferably has a low thermal conductivity in order to reduce the transfer of heat from the platen 205 to the interface between the lower surface 213 of the stem 210 and the upper surface 223 of the adapter 220 wherein the inner and outer O-rings 230, 231 are located. It is desirable to maintain the interface at lower temperatures (e.g., about 200° C. to 300° C.). For example, if the inner and outer O-rings 230, 231 are subjected to too high of a temperature during processing they will fail and no longer form a seal between the cylindrical interior region 215 of the stem 210 and the (vacuum) region surrounding the side wall 211 of the stem 210. In addition to the lower outer flange 234, which allows the thickness of side wall 211 of the stem 210 to be reduced, the stem 210 preferably includes a lower inner flange 233 that extends inwardly from the side wall 211 of the stem 210 such that the thickness of the side wall 211 of the stem 210 above the lower inner flange 233 may be minimized to form a thermal choke between the platen 205 and the lower surface 213 of the stem 210 during processing of a semiconductor substrate (see FIGS. 2-4, 6, and 7).

The thickness of the side wall 211 of the stem 210 is preferably less than the thickness of the side wall 221 of the adapter 220 such the side wall 211 of the stem 210 forms a thermal choke between the platen 205 and the lower surface 213 of the stem 210 during processing of a semiconductor substrate. In an embodiment, the thickness of the side wall 211 of the stem 210 above a lower flange of the stem 210 is about 3 mm or less, and more preferably about 2 mm or less. In a preferred embodiment, the thickness of the side wall 211 of the stem 210 is selected to be just greater than a minimum thickness needed for the stem 210 to withstand the pressure differentials between the cylindrical interior region 215 thereof, which is preferably maintained at atmospheric pressure, and the region surrounding the side wall 211, which is operated at a reduced or vacuum pressure during processing of a semiconductor substrate.

The adapter 220 is preferably formed of metal such as aluminum or an aluminum alloy, which is a cheaper material than the high purity ceramics used to form the stem 210 and platen 205, and is also less likely to break under the high pressure differentials exerted thereon during processing. Thus, by forming a thermal choke from the stem wall 211 of the stem 210, high temperatures (e.g. 550° C.-650° C. or more) used to process a semiconductor substrate supported on the upper surface 206 of the platen 205 may be thermally isolated from the lower surface 213 of the stem 210 such that the stem 210 may be attached to an upper surface 223 of an aluminum or aluminum alloy adapter 220 wherein the inner and outer O-rings 230, 231 will not be caused to fail due to high temperatures. Furthermore, forming the side wall 211 of the stem 210 into a thermal choke will allow the length of the stem 210 between the platen 205 and the lower surface 213 thereof to be reduced and the length of the adapter 220 to be increased to thereby provide a savings in the cost of materials.

As shown in FIG. 6, the adapter 220 can include one gas passage 232 in the side wall 221 thereof that is in fluid communication with at least two gas passages 217 in the side wall 211 of the stem 210 via the annular gas channel 242 in the upper surface 223 of the adapter 220 wherein each gas passage 217 in the side wall 211 of the stem 210 is in fluid communication with a respective platen gas passage 280 such that a backside gas may be supplied to a region below a semiconductor substrate when supported on the upper surface of the platen during processing by a backside gas supply.

In a further embodiment the at least one gas outlet 224 of the adapter 200 can be aligned or misaligned with one or more of the respective at least one gas inlet 216 of the stem 210. For example, the adapter 220 can include at least one gas passage 232 in the side wall 221 thereof that is in fluid communication at least one gas passage 217 in the side wall 211 of the stem 210 via the annular gas channel 242 in the upper surface 223 of the adapter 220 wherein at least one respective gas outlet 224 of the at least one gas passage 232 in the side wall 221 of the adapter 220 is aligned with at least one respective gas inlet 216 of the at least one gas passage 217 in the side wall 211 of the stem 210. Alternatively, the adapter 220 can include at least one gas passage 232 in the side wall 221 thereof that is in fluid communication at least one gas passage 217 in the side wall 211 of the stem 210 via the annular gas channel 242 in the upper surface 223 of the adapter 220 wherein at least one respective gas outlet 224 of the at least one gas passage 232 in the side wall 221 of the adapter 220 is misaligned with at least one respective gas inlet 216 of the at least one gas passage 217 in the side wall 211 of the stem 210.

While the plasma processing apparatus including an isothermal processing zone has been described in detail with reference to specific embodiments thereof, it will be apparent to those skilled in the art that various changes and modifications can be made, and equivalents employed, without departing from the scope of the appended claims.

What is claimed is:

1. A high temperature substrate pedestal module of a semiconductor substrate processing apparatus, the high temperature substrate pedestal module comprising:
    a platen having an upper surface configured to support a semiconductor substrate thereon during processing;
    a stem having a side wall defining a cylindrical interior region thereof, a lower surface, and an upper end that supports the platen wherein the lower surface of the stem is configured to be attached to an upper surface of an adapter;
    the lower surface of the stem including an annular gas channel including at least one gas inlet therein wherein the at least one gas inlet is in fluid communication with a respective gas passage located in the side wall of the stem and the at least one gas inlet in the lower surface of the stem is configured to be in fluid communication with at least one gas outlet in an upper surface of an adapter when the stem is attached to an adapter;
    wherein the platen includes at least one platen gas passage in fluid communication with a respective gas passage in the side wall of the stem through which backside gas can be supplied to a region below a semiconductor substrate when supported on the upper surface of the platen during processing.

2. The high temperature substrate pedestal module of claim 1, further comprising:
    an adapter wherein the lower surface of the stem is attached to an upper surface of the adapter, the upper surface of the adapter including an annular gas channel having at least one gas outlet therein that is in fluid communication with the at least one gas inlet of the stem, an inner groove radially inward of the at least one gas outlet wherein an inner O-ring is in the inner groove so as to form an inner vacuum seal between the cylindrical interior region of the stem and the at least one gas inlet in the lower surface of the stem, and an outer groove radially outward of the inner groove wherein an outer O-ring is in the outer groove so as to form an outer vacuum seal between a region surrounding the side wall of the stem and the at least one gas inlet in the lower surface of the stem.

3. The high temperature substrate pedestal module of claim 1, further comprising an adapter attached to the stem, the lower surface of the stem includes an inner groove radially inward of the at least one gas inlet with an inner O-ring therein forming an inner vacuum seal between the cylindrical interior region of the stem and the at least one gas inlet and an outer groove radially outward of the at least one gas inlet with an outer O-ring therein forming an outer vacuum seal between a region surrounding the side wall of the stem and the at least one gas inlet.

4. The high temperature substrate pedestal module of claim 1, wherein:
    (a) the stem includes a lower inner flange extending inwardly from the side wall of the stem such that the thickness of the side wall of the stem above the lower inner flange forms a thermal choke between the platen and the lower surface of the stem during processing; and/or
    (b) the stem includes a lower outer flange extending outwardly from the side wall of the stem such that the thickness of the side wall of the flange above the lower outer flange forms a thermal choke between the platen and the lower surface of the stem during processing.

5. The high temperature substrate pedestal module of claim 1, wherein:
(a) the thickness of the side wall of the stem is configured to be less than the thickness of the side wall of the adapter to which the stem may be attached such that the side wall of the stem forms a thermal choke between the platen and the lower surface of the stem during processing;
(b) the thickness of the side wall of the stem above a lower flange of the stem is about 3 mm or less, or about 2 mm or less; and/or
(c) exposed surfaces of the platen are made of ceramic material.

6. The high temperature substrate pedestal module of claim 1, wherein the high temperature substrate pedestal module further comprises:
(a) at least one electrostatic clamping electrode embedded in the platen;
(b) a bottom RF electrode embedded in the platen;
(c) a heater embedded in the platen;
(d) a plurality of lift pins configured to lower and raise a semiconductor substrate to and from the upper surface of the platen; or
(e) a single electrode embedded therein that is operable to serve as an electrostatic clamping electrode and a RF electrode.

7. The high temperature substrate pedestal module of claim 1, further comprising an adapter wherein the lower surface of the stem is attached to an upper surface of the adapter, the upper surface of the adapter having at least one gas outlet therein that is in fluid communication with the at least one gas inlet of the stem, an inner groove radially inward of the at least one gas outlet wherein an inner O-ring is in the inner groove so as to form an inner vacuum seal between the cylindrical interior region of the stem and the at least one gas inlet of the stem during processing, and an outer groove radially outward of the inner groove wherein an outer O-ring is in the outer groove so as to form an outer vacuum seal between a region surrounding the side wall of the stem and the at least one gas inlet of the stem during processing.

8. The high temperature substrate pedestal module of claim 1, further comprising an adapter wherein the lower surface of the stem is attached to an upper surface of the adapter, the upper surface of the adapter including an annular gas channel having at least one gas outlet therein that is in fluid communication with the at least one gas inlet of the stem, an inner groove radially inward of the at least one gas outlet with an inner O-ring therein forming an inner vacuum seal between the cylindrical interior region of the stem and the at least one gas inlet in the lower surface of the stem, and an outer groove radially outward of the inner groove with an outer O-ring therein forming an outer vacuum seal between a region surrounding the side wall of the stem and the at least one gas inlet in the lower surface of the stem, wherein the lower surface of the stem includes an inner groove adjacent the inner groove of the adapter and an outer groove adjacent the outer groove of the adapter, the inner groove of the stem including a portion of the inner O-ring therein and the outer groove of the stem including a portion of the outer O-ring therein.

9. The high temperature substrate pedestal module of claim 1, further comprising an adapter wherein the lower surface of the stem is attached to an upper surface of the adapter, the upper surface of the adapter including at least one gas outlet therein that is in fluid communication with the at least one gas inlet of the stem, an inner groove radially inward of the at least one gas outlet wherein an inner O-ring is in the inner groove so as to form an inner vacuum seal between the cylindrical interior region of the stem and the at least one gas inlet in the lower surface of the stem during processing, and an outer groove radially outward of the inner groove wherein an outer O-ring is in the outer groove so as to form an outer vacuum seal between a region surrounding the side wall of the stem and the at least one gas inlet in the lower surface of the stem during processing wherein the lower surface of the stem includes an inner groove adjacent the inner groove of the adapter and an outer groove adjacent the outer groove of the adapter, the inner groove of the stem including a portion of the inner O-ring therein and the outer groove of the stem including a portion of the outer O-ring therein.

10. The high temperature substrate pedestal module of claim 1, further comprising an adapter attached to the stem, the lower surface of the stem including an inner groove radially inward of the at least one gas inlet, an inner O-ring in the inner groove forming an inner vacuum seal between the cylindrical interior region of the stem and the at least one gas inlet, an outer groove radially outward of the at least one gas inlet, an outer O-ring in the outer groove forming an outer vacuum seal between a region surrounding the side wall of the stem and the at least one gas inlet, wherein the annular gas channel of the stem is formed in a radially inner portion of the outer groove of the stem and the outer O-ring is in a radially outer portion of the outer groove.

11. The high temperature substrate pedestal module of claim 1, wherein the high temperature substrate pedestal module further comprises at least one electrostatic clamping electrode embedded in the platen, a bottom RF electrode embedded in the platen, and a heater embedded in the platen.

* * * * *